United States Patent
Shizawa et al.

(10) Patent No.: US 9,559,732 B2
(45) Date of Patent: Jan. 31, 2017

(54) WIRELESS APPARATUS

(71) Applicant: FUJITSU LIMITED, Kawasaki-shi, Kanagawa (JP)

(72) Inventors: Yoshinobu Shizawa, Yokohama (JP); Hirotoshi Kanno, Kawasaki (JP); Yasushi Seino, Kawasaki (JP); Junya Morita, Yokohama (JP); Tsuneaki Tadano, Sendai (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/069,782

(22) Filed: Mar. 14, 2016

(65) Prior Publication Data

US 2016/0301432 A1    Oct. 13, 2016

(30) Foreign Application Priority Data

Apr. 10, 2015  (JP) .................................. 2015-081275

(51) Int. Cl.
*H04L 27/00* (2006.01)
*H04L 27/08* (2006.01)
*H04B 1/04* (2006.01)

(52) U.S. Cl.
CPC ..... *H04B 1/0475* (2013.01); *H04B 2001/0425* (2013.01)

(58) Field of Classification Search
USPC .............. 375/219, 220, 222, 240.26–240.27, 259,375/267, 284, 285, 295, 299, 316, 318, 346,375/354, 240
See application file for complete search history.

(56) References Cited

U.S. PATENT DOCUMENTS

| | | | |
|---|---|---|---|
| 6,580,901 B1 | 6/2003 | Mochizuki | |
| 8,731,496 B2 * | 5/2014 | Drogi | H03F 3/24 455/107 |
| 9,065,404 B2 * | 6/2015 | Hongo | H03F 1/0222 |
| 2008/0187035 A1 * | 8/2008 | Nakamura | H03F 1/0288 375/232 |
| 2010/0322640 A1 * | 12/2010 | Yamada | G03G 15/5079 399/11 |
| 2014/0266459 A1 * | 9/2014 | Scott | H03F 3/195 330/294 |

FOREIGN PATENT DOCUMENTS

| | | |
|---|---|---|
| EP | 1 612 933 A1 | 1/2006 |
| JP | 2000-183763 A | 6/2000 |
| JP | 2001-103100 A | 4/2001 |
| JP | 2002-359655 A | 12/2002 |
| JP | 2004-312344 A | 11/2004 |
| JP | 2010-278992 A | 12/2010 |

* cited by examiner

*Primary Examiner* — Linda Wong
(74) *Attorney, Agent, or Firm* — Arent Fox LLP

(57) ABSTRACT

A wireless apparatus including: an amplification circuit configured to generate a second signal by amplifying power of a first signal, a calculation circuit configured to calculate a deviation amount of phase deviation of the second signal from the first signal, and a correction circuit configured to correct the phase deviation using a correction method that is selected from a plurality of correction methods based on the deviation amount, the plurality of correction methods among which each power consumption is higher as each correction amount corresponding to each power consumption is greater.

7 Claims, 11 Drawing Sheets

FIG. 4

| ADDRESS | AMPLITUDE COMPONENT COEFFICIENT | PHASE COMPONENT COEFFICIENT |
|---|---|---|
| $a_1$ | $\alpha_1$ | $\beta_1$ |
| $a_2$ | $\alpha_2$ | $\beta_2$ |
| $a_3$ | $\alpha_3$ | $\beta_3$ |
| ⋮ | | |
| $a_n$ | $\alpha_n$ | $\beta_n$ |

FIG. 5

| CANDIDATE FOR CORRECTION METHOD | CORRECTION AMOUNT | POWER CONSUMPTION | FOLLOW-UP SPEED |
|---|---|---|---|
| (1) CORRECTION BY PHASE SHIFTER | SMALL | SMALL | LOW |
| (2) CORRECTION BY GATE VOLTAGE $V_{gs}$ | MEDIUM | MEDIUM | MEDIUM |
| (3) CORRECTION BY DRAIN VOLTAGE $V_{ds}$ | GREAT | GREAT | MEDIUM |

FIG. 7

| THRESHOLD VALUE RANGE | CANDIDATE FOR CORRECTION METHOD |
|---|---|
| (a) $\phi_{th} \leq |\Delta\phi(t)| < \phi_{th1}$ | (1) CORRECTION BY PHASE SHIFTER |
| (b) $\phi_{th1} \leq |\Delta\phi(t)| < \phi_{th2}$ | (2) CORRECTION BY GATE VOLTAGE $V_{gs}$ |
| (c) $\phi_{th2} \leq |\Delta\phi(t)|$ | (3) CORRECTION BY DRAIN VOLTAGE $V_{ds}$ |

WIRELESS APPARATUS

CROSS-REFERENCE TO RELATED APPLICATION

This application is based upon and claims the benefit of priority of the prior Japanese Patent Application No. 2015-081275, filed on Apr. 10, 2015, the entire contents of which are incorporated herein by reference.

FIELD

The present embodiment relates to a wireless apparatus.

BACKGROUND

A wireless apparatus such as, for example, a base station or a user terminal in a wireless communication system includes an amplifier (power amplifier: hereinafter referred to sometimes as "PA") for amplifying power of a transmission signal. In a wireless apparatus, a PA is caused to operate in the proximity of a saturation region of the PA in order to assure a high power efficiency of the PA. However, if the PA operates in the proximity of the saturation region, then the nonlinear distortion increases. Therefore, in order to suppress the nonlinear distortion of the PA to reduce adjacent channel leakage power (ACP), the wireless apparatus includes a distortion compensation unit for compensating for the nonlinear distortion of the PA.

As one of distortion compensation types used in the distortion compensation unit, a "pre-distortion (hereinafter referred to sometimes as "PD") type" is available. The distortion compensation unit of the PD type improves the linearity of an output signal of the PA to suppress the distortion to occur in the output signal of the PA by multiplying a transmission baseband signal before inputting to the PA by a distortion compensation coefficient having an inverse characteristic to the nonlinear distortion by the PA in advance. By the multiplication of the transmission baseband signal by the distortion compensation coefficient, both of the distortion of an amplitude component of the transmission baseband signal and the distortion of a phase component of the transmission baseband signal are compensated for. In the following description, a signal after a transmission baseband signal is multiplied by a distortion compensation coefficient is sometimes referred to as "pre-distortion signal (PD signal)." Therefore, a PD signal is a signal distorted in advance in accordance with the inverse characteristic of nonlinear distortion by a PA before the PD signal is inputted to the PA. Further, in the following description, distortion of an amplitude component of a transmission baseband signal is sometimes referred to as "amplitude distortion," and distortion of a phase component of a transmission baseband signal is sometimes referred to as "phase distortion."

For example, some distortion compensation unit of the PD type includes a lookup table in which a plurality of distortion compensation coefficients are stored (such a lookup table is sometimes referred to as "distortion compensation table"). A distortion compensation unit that includes a distortion compensation table reads out a distortion compensation coefficient corresponding to an amplitude value of a transmission baseband signal inputted to the distortion compensation unit from the distortion compensation table and multiplies the transmission baseband signal by the distortion compensation coefficient. Each distortion compensation coefficient stored in the distortion compensation table is successively updated such that the error between the transmission baseband signal as a reference signal and a signal outputted from the PA and fed back to the distortion compensation unit (such a signal is hereinafter referred to sometimes as "feedback signal") may be minimized.

PRIOR ART DOCUMENTS

Patent Documents

[Patent Document 1] Japanese Laid-open Patent Publication No. 2004-312344
[Patent Document 2] Japanese Laid-open Patent Publication No. 2000-183763
[Patent Document 3] Japanese Laid-open Patent Publication No. 2010-278992
[Patent Document 4] Japanese Laid-open Patent Publication No. 2001-103100
[Patent Document 5] Japanese Laid-open Patent Publication No. 2002-359655

SUMMARY

According to an aspect of the invention, a wireless apparatus includes an amplification circuit configured to generate a second signal by amplifying power of a first signal, a calculation circuit configured to calculate a deviation amount of phase deviation of the second signal from the first signal, and a correction circuit configured to correct the phase deviation using a correction method that is selected from a plurality of correction methods based on the deviation amount, the plurality of correction methods among which each power consumption is higher as each correction amount corresponding to each power consumption is greater.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a view depicting an example of a distortion compensation table of the working example 1;
FIG. 5 is a view illustrating an example of operation of the wireless apparatus of the working example 1;
FIG. 7 is a view illustrating an example of operation of a wireless apparatus of a working example 2.

DESCRIPTION OF EMBODIMENT

Figure 1:
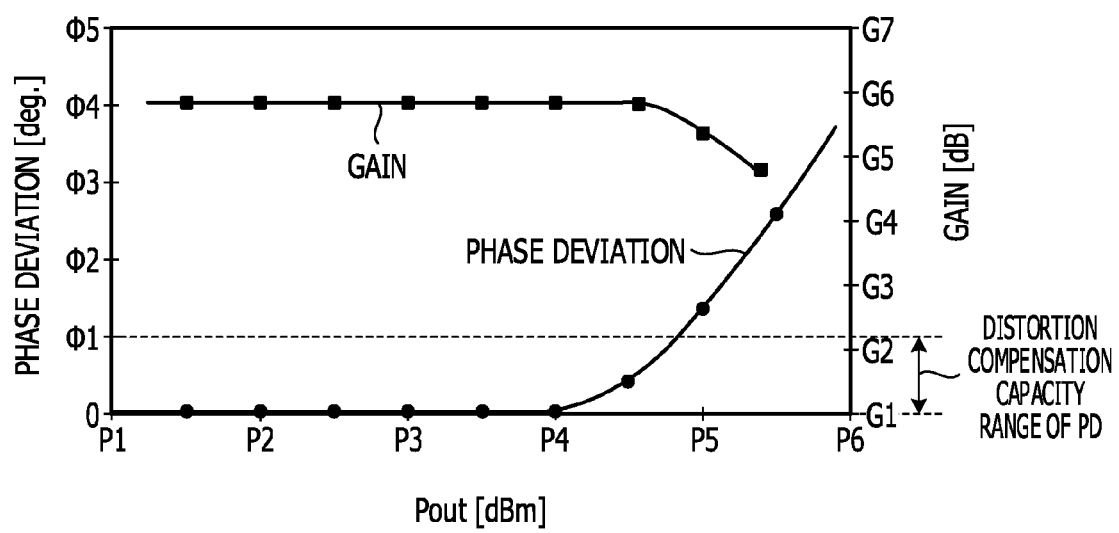
FIG. 1 is a view illustrating a subject to be solved.

Here, an example of a relationship between the power Pout of an output signal of a PA of a PD target and a phase difference between input and output signals of the PA (in other words, a phase deviation of the output signal of the PA from the input signal of the PA) and an example of a relationship between the power Pout and the gain of the PA are depicted in FIG. 1. FIG. 1 is a view illustrating a subject to be solved. The phase deviation increases in a saturation region of the PA, for example, as depicted in FIG. 1. In particular, the output signal has no phase deviation up to a given value of the power Pout (here, for example, to P4 [dBm]), and as the power Pout increases from the given value, the phase deviation gradually increases. Also the phase distortion increases together with the increase of the phase deviation.

In contrast, in a distortion compensation unit of the PD type, a distortion compensation capacity range of the PD is sometimes limited by such a reason as, for example, reduction of the circuit scale. For example, due to reduction or the like of the capacity of a memory for storing a distortion compensation table, not distortion compensation coefficients that cover the overall range of the phase deviation that may possibly occur in the PA but distortion compensation coefficients that cover the phase deviation only in a partial range are sometimes stored in the distortion compensation table. For example, in FIG. 1, the distortion compensation capacity range of the PD is limited to a range within which the phase deviation is smaller than φ1 degree.

Meanwhile, it sometimes occurs that, for example, by a temperature variation or the like of a PA by a variation of the installation environment of a wireless apparatus, a characteristic of the PA varies and the deviation amount of the phase deviation increases exceeding an assumed value. Therefore, the deviation amount of the phase deviation sometimes exceeds the distortion compensation capacity range of the PD. If the deviation amount of the phase deviation exceeds the distortion compensation capacity range of the PD, then the PD may not sufficiently compensate for the phase distortion, and consequently, the ACP increases to deteriorate an adjacent channel leakage ratio (ACLR). For example, if the PD whose target is a PA having the characteristic depicted in FIG. 1 suffers from phase deviation equal to or greater than φ1 degree, then the PD may not compensate for the phase distortion any more.

Therefore, it seems a recommendable countermeasure to compensate for phase deviation by some method. Since the correction of the phase deviation is an additional process, the power consumption of the wireless apparatus increases by performing correction of the phase deviation.

The technology disclosed herein has been made in view of such a situation as described above, and it is desirable to improve the ACLR with minimal power consumption.

In the following, working examples of the wireless apparatus disclosed herein are described with reference to the drawings. It is to be noted that the wireless apparatus disclosed herein shall not be limited by the working examples. Further, like elements having like functions and like steps at which like processes are performed in the working examples are denoted by like reference symbols, and overlapping description of them is omitted herein.

WORKING EXAMPLE 1

<Example of Configuration of Wireless Apparatus>

Figure 2:
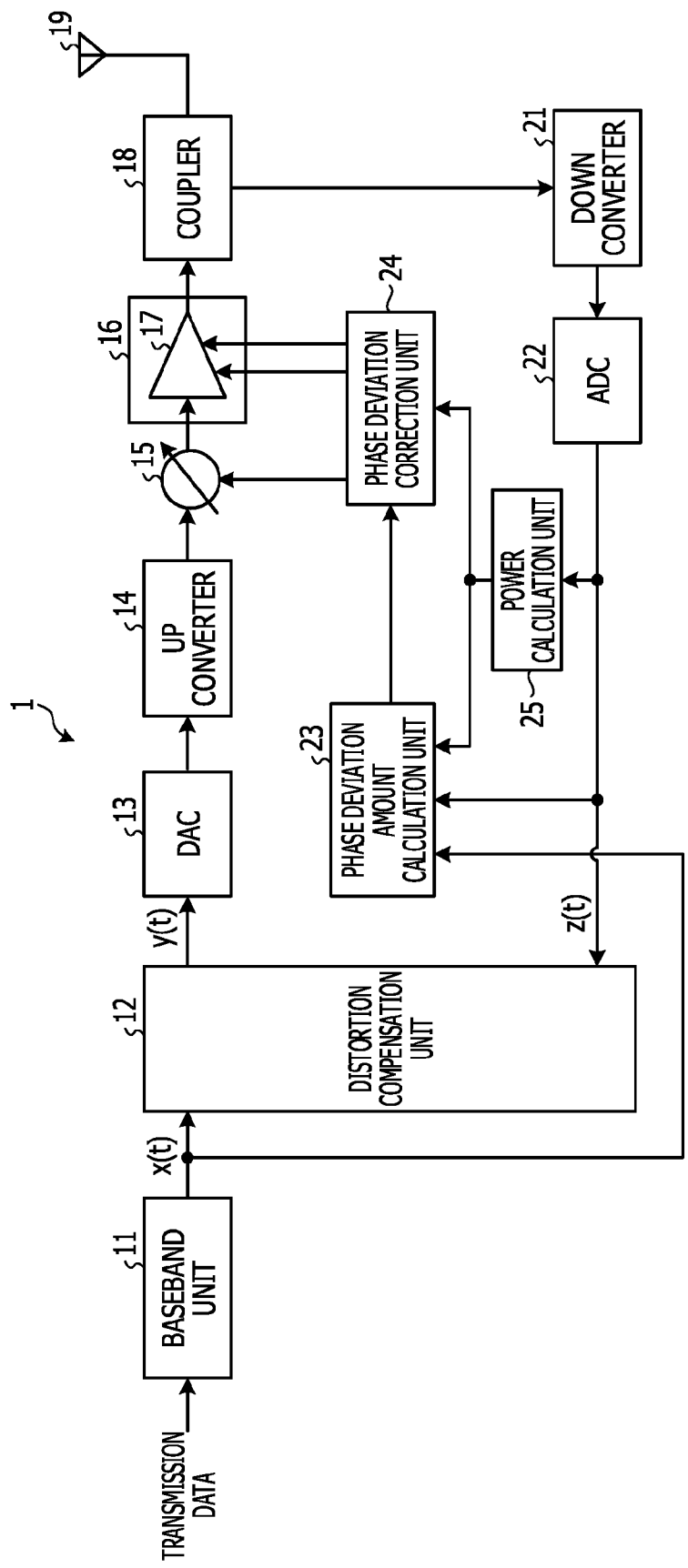
FIG. 2 is a block diagram depicting an example of a configuration of a wireless apparatus of a working example 1.

FIG. 2 is a block diagram depicting an example of a configuration of a wireless apparatus of a working example 1. Referring to FIG. 2, the wireless apparatus 1 includes a baseband unit 11, a distortion compensation unit 12, a digital to analog converter (DAC) 13, an up converter 14, a phase shifter 15, an amplification unit 16, a coupler 18, and an antenna 19. The wireless apparatus 1 further includes a down converter 21, an analog to digital converter (ADC) 22, a phase deviation amount calculation unit 23, a phase deviation correction unit 24, and a power calculation unit 25. FIG. 2 depicts a case in which the amplification unit 16 includes one stage of a PA 17. The PA 17 is, for example, a laterally diffused metal oxide semiconductor field effect transistor (LD MOSFET), a gallium arsenide FET (GaAs FET), a gallium nitride high electron mobility transistor (GaN HEMT) or the like. The wireless apparatus 1 is installed in a base station, a user terminal or the like, for example, in a wireless communication system.

The baseband unit 11 performs baseband processes such as an encoding process, a modulation process and so forth for transmission data inputted thereto to generate a transmission baseband signal x(t) and outputs the generated transmission baseband signal x(t) to the distortion compensation unit 12 and the phase deviation amount calculation unit 23. The transmission baseband signal x(t) includes an amplitude component and a phase component. Further, the transmission baseband signal x(t) includes an I component and a Q component. Where the transmission baseband signal x(t) includes an I component and a Q component, the amplitude component and the phase component of the transmission baseband signal x(t) vary in response to transmission data.

The distortion compensation unit 12 (may be a distortion compensation circuit) compensates for the nonlinear distortion of the PA 17 by performing PD for the transmission baseband signal x(t) using a distortion compensation coefficient. In particular, the distortion compensation unit 12 compensates for distortion occurring with a signal after amplification by the PA 17. For example, the distortion compensation unit 12 multiplies the transmission baseband signal x(t) by the distortion compensation coefficient to generate a PD signal y(t) and outputs the generated PD signal y(t) to the DAC 13. Details of the distortion compensation unit 12 are hereinafter described.

The DAC 13 converts the PD signal y(t) from a digital signal into an analog signal and outputs the analog PD signal to the up converter 14.

The up converter 14 up converts the analog PD signal and outputs the PD signal after the up conversion to the phase shifter 15.

The phase shifter 15 is disposed at a stage following the up converter 14 and preceding to the PA 17, and changes the phase of the PD signal and outputs the PD signal after the phase shift to the PA 17 under the control of the phase deviation correction unit 24. The phase shifter 15 sometimes sets the changing amount of the phase to 0, namely, does not shift the phase of the PD signal, and outputs the PD signal inputted thereto from the up converter 14 as it is to the PA 17 in accordance with the control of the phase deviation correction unit 24. Details of operation of the phase shifter 15 are hereinafter described.

The PA 17 amplifies the power of the PD signal after the up conversion and outputs the signal after the amplification to the coupler 18. Further, the gate voltage $V_{gs}$ or the drain voltage $V_{ds}$ to the PA 17 is controlled by the phase deviation correction unit 24. Details of the control of the gate voltage $V_{gs}$ and the drain voltage $V_{ds}$ are hereinafter described.

The coupler 18 distributes the signal after the amplification outputted from the PA 17 to the antenna 19 and the down converter 21. Consequently, the signal outputted from the PA 17 is fed back to the distortion compensation unit 12 via the down converter 21 and the ADC 22.

The antenna 19 transmits the signal after the amplification by wireless transmission.

The down converter 21 down converts the signal inputted thereto from the coupler 18 and outputs the signal after the down conversion to the ADC 22.

The ADC 22 converts the signal after the down conversion from an analog signal into a digital signal and outputs the digital signal after the conversion as a feedback signal z(t) to the distortion compensation unit 12. The feedback signal z(t) is inputted also to the phase deviation amount calculation unit 23 and the power calculation unit 25.

The phase deviation amount calculation unit 23 (may be a phase deviation amount calculation circuit) compares the phase of the transmission baseband signal x(t) and the phase of the feedback signal z(t) with each other to calculate a deviation amount $\Delta\phi(t)$ of phase deviation of the feedback signal z(t) with respect to the transmission baseband signal x(t). The phase deviation amount calculation unit 23 performs the calculation of the deviation amount $\Delta\phi(t)$, for example, by subtracting the phase of the transmission baseband signal x(t) from the phase of the feedback signal z(t). The phase deviation amount calculation unit 23 outputs the calculated deviation amount $\Delta\phi(t)$ to the phase deviation correction unit 24. Here, the transmission baseband signal x(t) is an example of a signal before amplification by the PA 17 and the feedback signal z(t) is an example of a signal after amplification by the PA 17.

The phase deviation correction unit 24 (may be a phase deviation correction circuit) corrects phase deviation of the feedback signal z(t) with respect to the transmission baseband signal x(t) using a correction method suitable for a deviation amount calculated by the phase deviation amount calculation unit 23. This correction of phase deviation is performed by controlling the phase shifter 15, the gate voltage $V_{gs}$ of the PA 17 and the drain voltage $V_{ds}$ of the PA 17 by the phase deviation correction unit 24. Details of the correction of phase deviation are hereinafter described.

The power calculation unit 25 (may be a power calculation circuit) calculates a power value $P_{z(t)}$ of the feedback signal z(t) and outputs the calculated power value $P_{z(t)}$ to the phase deviation amount calculation unit 23 and the phase deviation correction unit 24.

<Example of Configuration of Distortion Compensation Unit>

Figure 3:
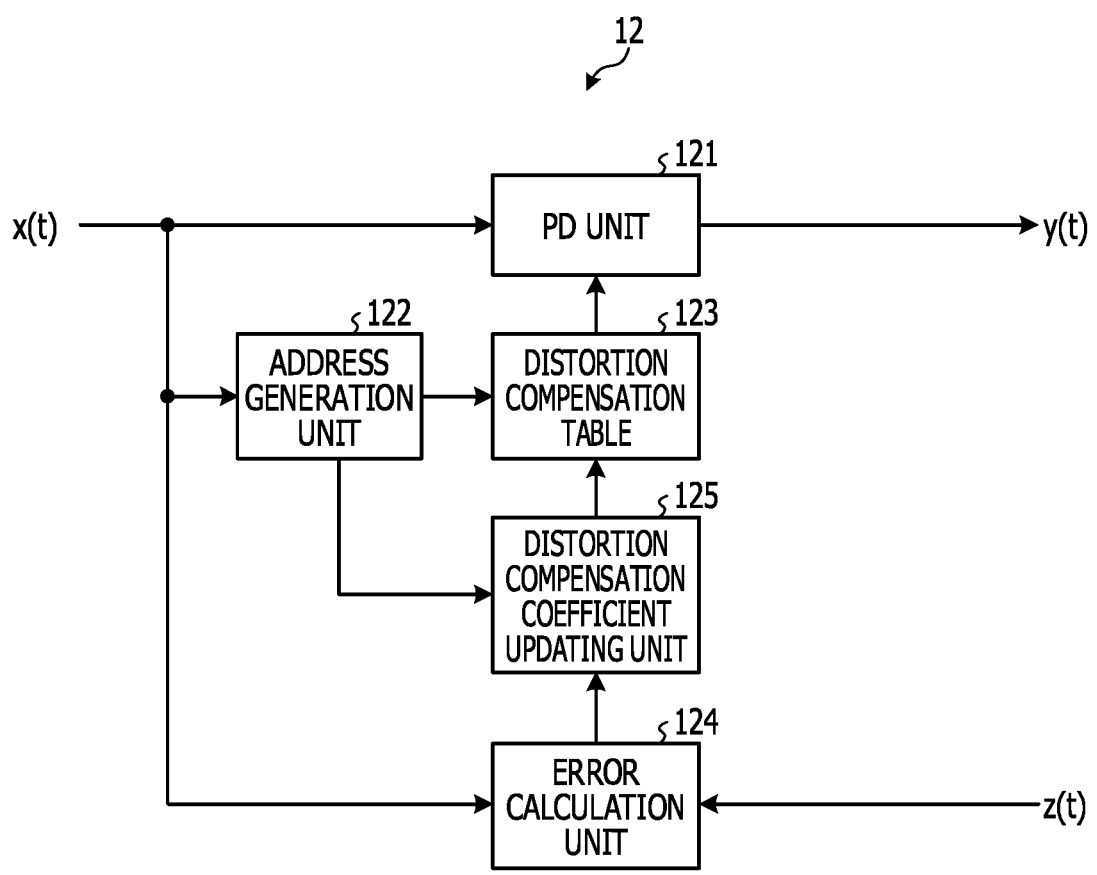
FIG. 3 is a block diagram depicting an example of a configuration of a distortion compensation unit of the working example 1.

FIG. 3 is a block diagram depicting an example of a configuration of a distortion compensation unit of the working example 1. The distortion compensation unit depicted in FIG. 3 may be the distortion compensation unit 12 depicted in FIG. 2. Referring to FIG. 3, the distortion compensation unit 12 includes a PD unit 121, an address generation unit 122, a distortion compensation table 123, an error calculation unit 124 and a distortion compensation coefficient updating unit 125.

In the distortion compensation unit 12, a transmission baseband signal x(t) is inputted to the PD unit 121 and the address generation unit 122. Further, the transmission baseband signal x(t) is inputted as a reference signal to the error calculation unit 124.

The address generation unit 122 determines an amplitude value of the transmission baseband signal x(t) and generates an address corresponding to the determined amplitude value. Further, the address generation unit 122 designates the generated address to the distortion compensation table 123 and outputs the generated address to the distortion compensation coefficient updating unit 125.

The distortion compensation table 123 stores a plurality of addresses and a plurality of distortion compensation coefficients individually corresponding to the plurality of addresses. The distortion compensation table 123 outputs a distortion compensation coefficient corresponding to an address designated from the address generation unit 122 to the PD unit 121. Each of the distortion compensation coefficients stored in the distortion compensation table 123 includes an amplitude component coefficient and a phase component coefficient.

FIG. 4 is a view depicting an example of a distortion compensation table of the working example 1. The distortion compensation table depicted in FIG. 4 may be the distortion compensation table 123 depicted in FIG. 3. As depicted in FIG. 4, in the distortion compensation table 123, for example, an amplitude component coefficient $\alpha_n$ and a phase component coefficient $\beta_n$ in pair are associated with an address $a_n$. The value of the amplitude component coefficient and the value of the phase component coefficient are values corresponding to the address, and, for example, as the address value increases, also the value of the amplitude component coefficient and the value of the phase component coefficient increase. For example, where the address designated from the address generation unit 122 is $a_2$, the distortion compensation table 123 outputs $\alpha_2$ as the amplitude component coefficient and $\beta_2$ as the phase component coefficient to the PD unit 121.

The PD unit 121 performs PD for the transmission baseband signal x(t) using the distortion compensation coefficient inputted thereto from the distortion compensation table 123. For example, the PD unit 121 multiplies the transmission baseband signal x(t) by the distortion compensation coefficient and outputs a signal after the multiplication as a PD signal y(t) to the DAC 13. Since the distortion compensation coefficient includes an amplitude component coefficient and a phase component coefficient as described hereinabove, distortion compensation is performed for both of the amplitude component and the phase component of the transmission baseband signal x(t) by the PD performed by the PD unit 121. Therefore, both of the amplitude distortion and the phase distortion which occur with the signal after the amplification by the PA 17 are compensated for by the PD performed by the PD unit 121.

The error calculation unit 124 calculates an error between the transmission baseband signal x(t) and the feedback signal z(t) and outputs the calculated error to the distortion compensation coefficient updating unit 125. The error calculated by the error calculation unit 124 includes an amplitude error and a phase error.

The distortion compensation coefficient updating unit 125 calculates a distortion compensation coefficient, which minimizes the error inputted from the error calculation unit 124, using, for example, the least mean square (LMS) algorithm. The distortion compensation coefficient updating unit 125 updates, from among a plurality of distortion compensation coefficients stored in the distortion compensation table 123, the distortion compensation coefficient corresponding to the address inputted from the address generation unit 122 with the calculated distortion compensation coefficient.

<Example of Operation of Wireless Apparatus>

FIG. 5 is a view illustrating an example of operation of the wireless apparatus of the working example 1. As depicted in FIG. 5, as a candidate for the correction method to be used for correction of phase deviation, for example, three correction methods by (1) correction by a phase shifter, (2) correction by the gate voltage $V_{gs}$ and (3) correction by the drain voltage $V_{ds}$ are available.

Here, the (1) correction by a phase shifter (hereinafter referred to sometimes as "correction method (1)") corrects phase deviation by changing the phase of the PD signal by the phase shifter 15. Where correction by the phase shifter is to be performed, the phase deviation correction unit 24 controls the phase shifter 15 to change the phase of the PD signal by a given amount $\Delta\phi_{(1)}$ to correct the phase deviation by the given amount $\Delta\phi_{(1)}$. When the deviation amount calculated by the phase deviation amount calculation unit 23 is $+\Delta\phi(t)$, the phase deviation correction unit 24 changes the phase of the PD signal by $-\Delta\phi_{(1)}$. However, when the deviation amount calculated by the phase deviation amount calculation unit 23 is $-\Delta\phi(t)$, the phase deviation correction unit 24 changes the phase of the PD signal by $+\Delta\phi_{(1)}$. The power consumption where correction of the correction method (1) is used is, for example, a given amount $P_{(1)}$.

Meanwhile, the (2) correction by the gate voltage $V_{gs}$ (hereinafter referred to sometimes as "correction method (2)") corrects phase deviation by increasing the gate voltage $V_{gs}$ of the PA 17. If the gate voltage $V_{gs}$ is increased, then the phase deviation occurring in the PA 17 decreases. When correction by the gate voltage $V_{gs}$ is to be performed, the phase deviation correction unit 24 corrects the phase deviation by a given amount $\Delta\phi_{(2)}$ by increasing the gate voltage $V_{gs}$ of the PA 17 by a given amount $\Delta V_A$. The power consumption where correction of the correction method (2) is used is, for example, a given amount $P_{(2)}$.

On the other hand, the (3) correction by the drain voltage $V_{ds}$ (hereinafter referred to sometimes as "correction method (3)") corrects phase deviation by increasing the drain voltage $V_{ds}$ of the PA 17. If the drain voltage $V_{ds}$ is increased, then the phase deviation occurring in the PA 17 decreases. When correction by the drain voltage $V_{ds}$ is to be performed, the phase deviation correction unit 24 corrects the phase deviation by a given amount $\Delta\phi_{(3)}$ by increasing the drain voltage $V_{ds}$ of the PA 17 by a given amount $\Delta V_B$. The power consumption where correction of the correction method (3) is used is, for example, a given amount $P_{(3)}$.

Here, in the three correction methods described above, the relationship among the correction amount, power consumption and follow-up speed with respect to the phase change of the transmission baseband signal x(t) is such, for example, as depicted in FIG. 5.

In particular, where the three correction methods are compared with each other in terms of the correction amount, the relationship in correction amount is "correction method (1)<correction method (2)<correction method (3)." In other words, "$\Delta\phi_{(1)}<\Delta\phi_{(2)}<\Delta\phi_{(3)}$."

On the other hand, where the three correction methods are compared with each other in terms of the power consumption, the relationship in power consumption is "correction method (1)<correction method (2)<correction method (3)." In other words, "$P_{(1)}<P_{(2)}<P_{(3)}$."

Meanwhile, where the three correction methods are compared with each other in terms of the follow-up speed, the relationship in follow-up speed is that the follow-up speed is higher in the correction method (2) and the correction method (3) than in the correction method (1) and is equal between the correction method (2) and the correction method (3).

In short, the three correction methods (1) to (3) are different in correction amount and power consumption from one another. Further, the three correction methods (1) to (3) possess power consumption that increases as the correction amount increases. In other words, the correction methods (1) to (3) have a tradeoff relationship in correction amount and power consumption.

The phase deviation correction unit 24 corrects phase deviation of the feedback signal z(t) with respect to the transmission baseband signal x(t) using a correction method suitable for a deviation amount calculated by the phase deviation amount calculation unit 23 from among the correction methods (1) to (3). It is to be noted here that the expression "correction method suitable for a deviation amount" is used herein as a concept that includes also an embodiment in which the "deviation amount calculated by the phase deviation amount calculation unit 23" and a "correction method" are associated indirectly with each other like a correction method that corresponds to a register value counted in response to the deviation amount calculated by the phase deviation amount calculation unit 23.

<Example of Processing of Wireless Apparatus>

Figure 6:
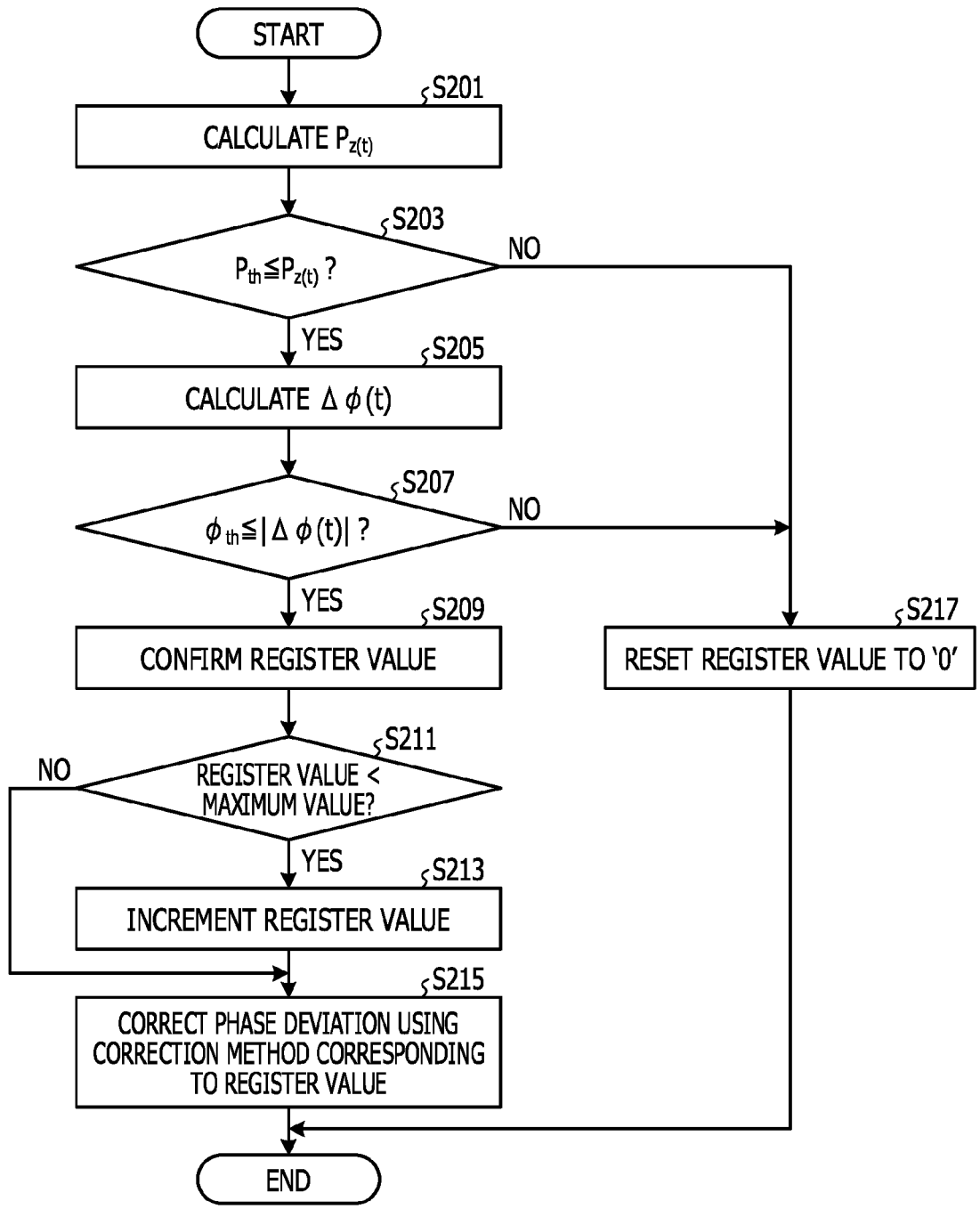
FIG. 6 is a flow chart illustrating an example of processing of the wireless apparatus of the working example 1.

FIG. 6 is a flow chart illustrating an example of processing of the wireless apparatus of the working example 1. The flow chart depicted in FIG. 6 is started, for example, at every control timing that comes at fixed intervals. In other words, every time a control timing comes, a series of processes depicted in FIG. 6 is executed. For example, the control timing is set to a timing immediately after an updating timing of a distortion compensation coefficient.

At step S201, the power calculation unit 25 calculates the power value $P_{z(t)}$ of the feedback signal z(t) and outputs the calculated power value $P_{z(t)}$ to the phase deviation amount calculation unit 23 and the phase deviation correction unit 24.

At step S203, the phase deviation amount calculation unit 23 and the phase deviation correction unit 24 perform threshold value decision of comparing the power value $P_{z(t)}$ and a threshold value $P_{th}$ with each other.

If the power value $P_{z(t)}$ is equal to or higher than the threshold value $P_{th}$ (step S203: Yes), then the phase deviation amount calculation unit 23 calculates the deviation amount $\Delta\phi(t)$ of the phase deviation and outputs the calculated deviation amount $\Delta\phi(t)$ to the phase deviation correction unit 24 at step S205. On the other hand, if the power value $P_{z(t)}$ is lower than the threshold value $P_{th}$ (step S203: No), then the phase deviation amount calculation unit 23 does not perform calculation of the deviation amount $\Delta\phi(t)$.

Further, if the power value $P_{z(t)}$ is equal to or higher than the threshold value $P_{th}$ (step S203: Yes), then at step S207 after the process at step S205, the phase deviation correction unit 24 performs threshold value decision of comparing an absolute value $|\Delta\phi(t)|$ of the deviation amount and a threshold value $\phi_{th}$ with each other.

If the absolute value $|\Delta\phi(t)|$ is equal to or higher than the threshold value $\phi_{th}$ (step S207: Yes), then the phase deviation correction unit 24 confirms the value of a register (not depicted) the phase deviation correction unit 24 includes (step S209).

Here, the value of the register the phase deviation correction unit 24 includes corresponds to one of the correction methods. For example, the register value='1' corresponds to the correction method (1); the register value='2' corresponds to the correction method (2); and the register value '3' corresponds to the correction method (3). Therefore, the confirmation of the register value at step S209 corresponds to the confirmation of a correction method used at a control timing in the preceding operation cycle. Further, that the register value is '0' represents that correction of phase deviation was not performed at the control timing in the preceding operation cycle. Further, if the candidates for the correction method are three including the correction methods (1) to (3) as described above, the maximum value of the register value is set to '3.'

Subsequently, at step S211, the phase deviation correction unit 24 decides whether or not the register value is lower than the maximum value. If the register value is lower than the maximum value (step S211: Yes), then the phase deviation correction unit 24 increments the register value. In particular, the register value is increased by 1 (step S213). On the other hand, if the register value is equal to or higher than the maximum value, namely, if the register value reaches the maximum value (step S211: No), then the phase deviation correction unit 24 advances the processing to step S215 without performing the process at step S213.

At step S215, the phase deviation correction unit 24 corrects the phase deviation using the correction method corresponding to the register value. After the process at step S215, the processing at the current control timing is ended.

If the power value $P_{z(t)}$ is lower than the threshold value $P_{th}$ (step S203: No) or if the absolute value $|\Delta\phi(t)|$ is lower than the threshold value $\phi_{th}$ (step S207: No), then the phase deviation correction unit 24 resets the register value to '0' at step S217 without performing correction of the phase deviation. After the process at step S217, the processing at the current control timing is ended.

In the following, an example of processing of the wireless apparatus 1 where the candidates for the correction method are the correction methods (1) to (3) as described hereinabove is described. Since the candidates for the correction method are the correction methods (1) to (3), the maximum value of the register value is '3.' Further, it is assumed that, at any of control timings t1 to t4 described below, the power value $P_{z(t)}$ is equal to or higher than the threshold value $P_{th}$.

<Processing at Control Timing t1>

It is assumed that, when the control timing t1 comes, the register value is '0.' If the absolute value $|\Delta\phi(t)|$ is equal to or higher than the threshold value $\phi_{th}$, then the phase deviation correction unit 24 increments the register value to '1.' Then, the phase deviation correction unit 24 corrects the phase deviation using the correction method (1) corresponding to the register value='1.' In other words, the phase deviation correction unit 24 controls the phase shifter 15 to change the phase of the PD signal by the given amount $\Delta\phi_{(1)}$ to correct the phase deviation by the given amount $\Delta\phi_{(1)}$. By the correction using the correction method (1), the phase deviation is suppressed by the given amount $\Delta\phi_{(1)}$.

<Processing at Control Timing t2>

If correction of phase deviation is performed by the correction method (1) at the control timing t1, then when the control timing t2 that is a control timing next to the control timing t1 comes, the register value is '1.' Further, by the process at the control timing t1, the phase deviation is suppressed by the given amount $\Delta\phi_{(1)}$ in comparison with the phase deviation at an initial stage at which correction of the phase deviation is not performed as yet.

Also after the phase deviation is suppressed by the given amount $\Delta\phi_{(1)}$ by the correction method (1) at the control timing t1, if the absolute value $|\Delta\phi(t)|$ remains equal to or higher than the threshold value $\phi_{th}$, then the phase deviation correction unit 24 increments the register value to '2'. Then, the phase deviation correction unit 24 corrects the phase deviation using the correction method (2) corresponding to the register value='2' in place of the correction method (1). In particular, the phase deviation correction unit 24 corrects the phase deviation by the given amount $\Delta\phi_{(2)}$ by increasing the gate voltage $V_{gs}$ of the PA 17 by the given amount $\Delta V_A$. By the correction using the correction method (2), the phase deviation is suppressed by the given amount $\Delta\phi_{(2)}$.

On the other hand, if the absolute value $|\Delta\phi(t)|$ becomes lower than the threshold value $\phi_{th}$ as a result of the suppression of the phase deviation by the given amount $\Delta\phi_{(1)}$ by the correction method (1) at the control timing t1, then the phase deviation correction unit 24 resets the register value to '0' without performing correction of the phase deviation. When the absolute value $|\Delta\phi(t)|$ becomes lower than the threshold value $\phi_{th}$ as a result of the suppression of the phase deviation by the given amount $\Delta\phi_{(1)}$ by the correction method (1), the absolute value $|\Delta\phi(t)|$ before the correction at the control timing t1 was equal to or higher than the threshold value $\phi_{th}$ but lower than the given amount $\Delta\phi_{(1)}$.

<Process at Control Timing t3>

If correction of phase deviation is performed by the correction method (2) at the control timing t2, then when the control timing t3 that is a control timing next to the control timing t2 comes, the register value is '2.' Further, by the processing at the control timing t2, the phase deviation is suppressed by the given amount $\Delta\phi_{(2)}$ in comparison with the phase deviation at an initial stage at which correction of the phase deviation is not performed as yet.

Also after the phase deviation is suppressed by the given amount $\Delta\phi_{(2)}$ by the correction method (2) at the control timing t2, if the absolute value $|\Delta\phi(t)|$ is equal to or higher than the threshold value $\phi_{th}$, then the phase deviation correction unit 24 increments the register value '3'. Then, the phase deviation correction unit 24 corrects the phase deviation using the correction method (3) corresponding to the register value='3' in place of the correction method (2). In particular, the phase deviation correction unit 24 corrects the phase deviation by the given amount $\Delta\phi_{(3)}$ by increasing the drain voltage $V_{ds}$ of the PA 17 by the given amount $\Delta V_B$. By the correction using the correction method (3), the phase deviation is suppressed by the given amount $\Delta\phi_{(3)}$.

On the other hand, if the absolute value $|\Delta\phi(t)|$ becomes lower than the threshold value $\phi_{th}$ as a result of the suppression of the phase deviation by the given amount $\Delta\phi_{(2)}$ by the correction method (2) at the control timing t2, then the phase deviation correction unit 24 resets the register value to '0' without performing correction of the phase deviation. When the absolute value $|\Delta\phi(t)|$ becomes lower than the threshold value $\phi_{th}$ as a result of the suppression of the phase deviation by the given amount $\Delta\phi_{(2)}$ by the correction method (2), the absolute value $|\Delta\phi(t)|$ before the correction at the control timing t1 was equal to or higher than the given amount $\Delta\phi_{(1)}$ but lower than the given amount $\Delta\phi_{(2)}$.

<Process at Control Timing t4>

If correction of phase deviation is performed by the correction method (3) at the control timing t3, then when the timing t4 that is a control timing next to the control timing t3 comes, the register value has the maximum value of '3.' Further, by the process at the control timing t3, the phase deviation is suppressed by the given amount $\Delta\phi_{(3)}$ in comparison with the phase deviation at an initial stage at which correction of the phase deviation is not performed as yet.

If the absolute value $|\Delta\phi(t)|$ remains equal to or higher than the threshold value $\phi_{th}$ also after the phase deviation is suppressed by the given amount $\Delta\phi_{(3)}$ by the correction method (3) at the control timing t3, then since the register value is the maximum value of '3,' the phase deviation correction unit 24 continuously corrects the phase deviation using the correction method (3).

On the other hand, if the absolute value $|\Delta\phi(t)|$ becomes lower than the threshold value $\phi_{th}$ as a result of the suppression of the phase deviation by the given amount $\Delta\phi_{(3)}$ by the correction method (3) at the control timing t3, then the phase deviation correction unit 24 resets the register value to '0' without performing correction of the phase deviation. When the absolute value $|\Delta\phi(t)|$ becomes lower than the threshold value $\phi_{th}$ as a result of the suppression of the phase deviation by the given amount $\Delta\phi_{(3)}$ by the correction method (3), the absolute value $|\Delta\phi(t)|$ before the correction at the control timing t1 was equal to or higher than the given amount $\Delta\phi_{(2)}$ but lower than the given amount $\Delta\phi_{(3)}$.

An example of the processing of the wireless apparatus 1 is described above.

Here, for example, the threshold value $P_{th}$ is preferably set to a value equal to a rated output of the PA 17. This is because the rated output is usually set to a value around power with which phase deviation begins to occur in the PA 17.

Further, for example, the threshold value $\phi_{th}$ is preferably set to a value corresponding to the distortion compensation capacity of the distortion compensation unit 12. For example, the threshold value $\phi_{th}$ is set to a value corresponding to a maximum phase distortion that can be compensated for by the distortion compensation unit 12.

As described above, in the working example 1, the wireless apparatus 1 includes the amplification unit 16, phase deviation amount calculation unit 23 and phase deviation correction unit 24. The amplification unit 16 amplifies power of a signal. The phase deviation amount calculation unit 23 calculates a deviation amount of phase deviation of the signal after the amplification by the amplification unit 16 with respect to the signal before the amplification by the amplification unit 16. The phase deviation correction unit 24 corrects the phase deviation using a correction method suitable for the deviation amount calculated by the phase deviation amount calculation unit 23 from among the correction methods (1) to (3). The correction method (2) is greater in correction amount and higher in power consumption than the correction amount (1). Further, the correction method (3) is greater in correction amount and higher in power consumption than the correction method (1) and the correction method (2).

By the configuration of the wireless apparatus 1 just described, when the deviation amount of phase deviation is small, the phase deviation can be corrected using a correction method that is smaller in correction amount and besides is also lower in power consumption. On the other hand, when the deviation amount of phase deviation is great, the phase deviation can be corrected using a correction method that is greater in correction amount and besides is higher also in power consumption. Therefore, with the working example 1, since the deviation amount of the phase deviation can be set within the range of the distortion compensation capacity of the PD with minimal power consumption, the ACLR can be improved with minimal power consumption.

Further, in the working example 1, when the calculated absolute value $|\Delta\phi(t)|$ is equal to or higher than the threshold value $\phi_{th}$, the phase deviation correction unit 24 corrects phase deviation using the correction method (1) that possesses the correction amount $\Delta\phi_{(1)}$ and the power consumption $P_{(1)}$. Further, when the absolute value $|\Delta\phi(t)|$ calculated after the correction using the correction method (1) is equal to or higher than the threshold value $\phi_{th}$, the phase deviation correction unit 24 corrects the phase deviation using the correction method (2) that possesses the correction amount $\Delta\phi_{(2)}$ and the power consumption $P_{(2)}$ in place of the correction method (1). Further, when the absolute value $|\Delta\phi(t)|$ calculated after the correction using the correction method (2) is equal to or higher than the threshold value $\phi_{th}$, the phase deviation correction unit 24 corrects the phase deviation using the correction method (3) that possesses the correction amount $\Delta\phi_{(3)}$ and the power consumption $P_{(3)}$ in place of the correction method (2).

By the configuration of the wireless apparatus 1 just described, when the deviation amount of phase deviation is set within the range of the distortion compensation capacity of the PD, it is sufficient to set one threshold value to the deviation amount of phase deviation. Therefore, setting of the threshold value for the deviation amount is facilitated, and the burden of the development work of the wireless apparatus can be reduced.

Further, in the working example 1, the threshold value $\phi_{th}$ is set on the basis of the distortion compensation capacity of the distortion compensation unit 12.

By such setting, when the distortion compensation capacity of the distortion compensation unit 12 is high, the threshold value $\phi_{th}$ can be set to a high value, but when the distortion compensation capacity of the distortion compensation unit 12 is low, the threshold value $\phi_{th}$ can be set to a low value. Therefore, a threshold value optimum to the deviation amount of the phase deviation can be set.

Further, in the working example 1, the phase deviation correction unit 24 performs, when the power value of a signal after amplification is equal to or higher than the threshold value $P_{th}$, correction of phase deviation but does not perform, when the power value of a signal after amplification is lower than the threshold value $P_{th}$, correction of phase deviation.

By this configuration of the phase deviation correction unit 24, a correction process in a region in which the power value of a signal after amplification is lower than the threshold value, for example, in a region in which no phase deviation occurs, can be omitted. Therefore, the power consumption can be reduced.

WORKING EXAMPLE 2

<Example of Operation of Wireless Apparatus>

FIG. 7 is a view illustrating an example of operation of a wireless apparatus of a working example 2. In the working example 2, as depicted in FIG. 7, the correction methods (1) to (3) are associated with three threshold value ranges (a) to (c) of the absolute value $|\Delta\phi(t)|$ of the deviation amount of phase deviation. The threshold value $\phi_{th}$ depicted in FIG. 7 is same as the threshold value $\phi_{th}$ in the working example 1. Further, the relationship in magnitude among the threshold values depicted in FIG. 7 is $\phi_{th} < \phi_{th1} < \phi_{th2}$.

The phase deviation correction unit 24 corrects phase deviation using a correction method suitable for the deviation amount of phase deviation from among the correction methods (1) to (3). Therefore, the phase deviation correction unit 24 corrects the phase deviation using a correction method corresponding to a threshold value range within which the absolute value $|\Delta\phi(t)|$ of the deviation amount falls from among the threshold value ranges (a) to (c). For example, if the absolute value $|\Delta\phi(t)|$ of the deviation amount is equal to or higher than the threshold value $\phi_{th}$ and besides lower than the threshold value $\phi_{th1}$, then the phase deviation correction unit 24 corrects the phase deviation using the correction method (1). However, if the absolute value |Δϕ(t)| of the deviation amount is equal to or higher than the threshold value $\phi_{th1}$ and besides lower than the threshold value $\phi_{th2}$, then the phase deviation correction unit 24 corrects the phase deviation using the correction method (2). Further, if the absolute value |Δϕ(t)| of the deviation amount is equal to or higher than the threshold value $\phi_{th2}$, then the phase deviation correction unit 24 corrects the phase deviation using the correction method (3). It is to be noted that, when the absolute value |Δϕ(t)| of the deviation amount is lower than the threshold value $\phi_{th}$, the phase deviation correction unit 24 does not perform correction of phase deviation similarly as in the working example 1.

Here, in the working example 2, the correction amounts for the correction methods are set so as to satisfy, for example, $\Delta\phi_{(1)} = \phi_{th1}$, $\Delta\phi_{(2)} = \phi_{th2}$, and $\Delta\phi_{(3)} > \phi_{th2}$.

<Example of Processing of Wireless Apparatus>

Figure 8:
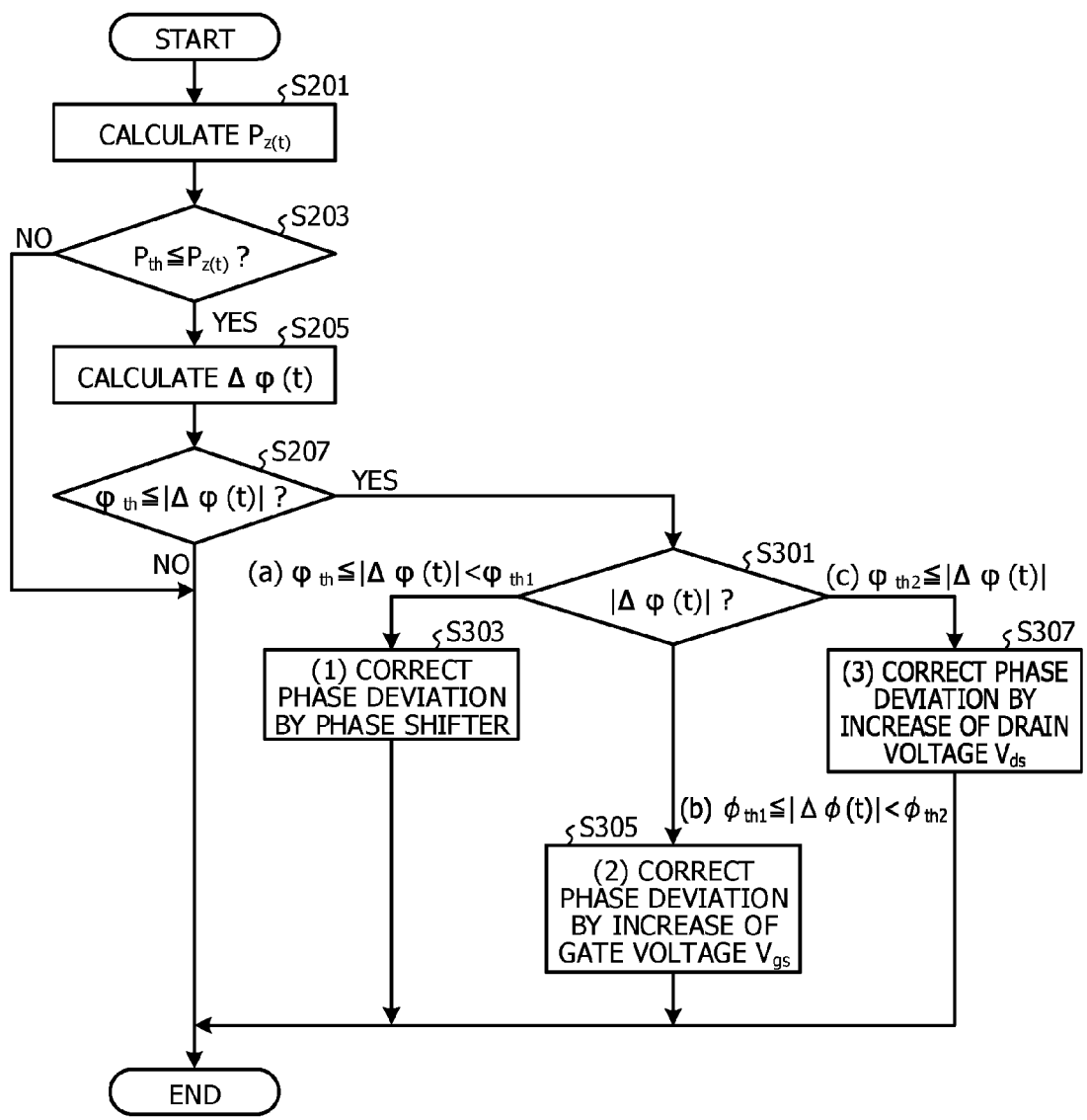
FIG. 8 is a flow chart illustrating an example of processing of the wireless apparatus of the working example 2.

FIG. 8 is a flow chart illustrating an example of processing of the wireless apparatus of the working example 2. The flow chart depicted in FIG. 8 is started, for example, at each control timing that comes at fixed intervals similarly as in the working example 1. In other words, every time a control timing comes, a series of processes depicted in FIG. 8 is executed. For example, the control timing is set to a timing immediately after an updating timing of a distortion compensation coefficient.

Referring to FIG. 8, processes at steps S201 to S207 are same as the processes in the working example 1, and therefore, overlapping description of them is omitted herein.

If the result of the threshold value decision at step S207 indicates that the absolute value |Δϕ(t)| is equal to or higher than the threshold value $\phi_{th}$ (step S207: Yes), then the phase deviation correction unit 24 performs the following decision. In particular, if the absolute value |Δϕ(t)| is equal to or higher than the threshold value $\phi_{th}$ (step S207: Yes), then the phase deviation correction unit 24 decides within which one of the three threshold value ranges (a) to (c) depicted in FIG. 7 the absolute value |Δϕ(t)| falls (step S301).

If it is decided that the absolute value |Δϕ(t)| falls within the threshold value range (a), then the phase deviation correction unit 24 corrects the phase deviation using the correction method (1) (step S303).

However, if it is decided that the absolute value |Δϕ(t)| falls within the threshold value range (b), then the phase deviation correction unit 24 corrects the phase deviation using the correction method (2) (step S305).

On the other hand, if it is decided that the absolute value |Δϕ(t)| falls within the threshold value range (c), then the phase deviation correction unit 24 corrects the phase deviation using the correction method (3) (step S307).

After the process at any of steps S303, S305 and S307, the processing at the current control timing is ended.

If the power value $P_{z(t)}$ is lower than the threshold value $P_{th}$ (step S203: No) or if the absolute value |Δϕ(t)| is lower than the threshold value $\phi_{th}$ (step S207: No), then the phase deviation correction unit 24 ends the processing at the current control timing without performing correction of the phase deviation.

As described above, in the working example 2, the wireless apparatus 1 includes the amplification unit 16, phase deviation amount calculation unit 23 and phase deviation correction unit 24. The amplification unit 16 amplifies power of a signal. The phase deviation amount calculation unit 23 calculates a deviation amount of phase deviation of the signal after the amplification by the amplification unit 16 with respect to the signal before the amplification by the amplification unit 16. The phase deviation correction unit 24 corrects the phase deviation using a correction method suitable for the deviation amount calculated by the phase deviation amount calculation unit 23 from among the correction methods (1) to (3). The correction method (2) is greater in correction amount and higher in power consumption than the correction method (1). Further, the correction method (3) is greater in correction amount and higher in power consumption than the correction method (1) and the correction method (2).

By the configuration of the wireless apparatus 1 just described, when the deviation amount of phase deviation is small, the phase deviation can be corrected using a correction method that is smaller in correction amount and besides is lower also in power consumption. On the other hand, when the deviation amount of phase deviation is great, the phase deviation can be corrected using a correction method that is greater in correction amount and besides is higher also in power consumption. Therefore, with the working example 2, since the deviation amount of the phase deviation can be set within the range of the distortion compensation capacity of the PD with minimal power consumption, the ACLR can be improved with minimal power consumption.

Further, in the working example 2, the correction methods (1) to (3) are associated with the threshold value ranges (a) to (c) for the absolute value |Δϕ(t)| of the deviation amount, respectively. The phase deviation correction unit 24 corrects the phase deviation using a correction method corresponding to the threshold value range within which the absolute value |Δϕ(t)| falls from among the threshold value ranges (a) to (c).

In the working example 1, since only one threshold value may be set for the deviation amount of phase deviation as described hereinabove, setting of the threshold value for the deviation amount is facilitated and the burden of the development work of the wireless apparatus can be reduced. Meanwhile, in the working example 1, where the deviation amount of phase deviation is great, threshold value decision for an absolute value of a deviation amount is sometimes repeated over a plurality of control timings before the deviation amount of the phase deviation is suppressed to a level within the range of the distortion compensation capacity of the PD. Therefore, in the working example 1, a long period of time is taken occasionally before the deviation amount of phase deviation is suppressed to a level within the range of the distortion compensation capacity of the PD. In contrast, in the working example 2, since the correction methods (1) to (3) are associated with the threshold value ranges (a) to (c) as described above, respectively, a correction method for suppressing the deviation amount to a level within the range of the distortion compensation capacity of the PD can be determined at one control timing irrespective of the magnitude of the deviation amount of the phase deviation. Therefore, with the working example 2, reduction in power consumption can be anticipated in comparison with the working example 1.

WORKING EXAMPLE 3

A working example 3 is different from the working example 1 and the working example 2 in configuration of the amplification unit.

<Example of Configuration of Amplification Unit>

Figure 9:
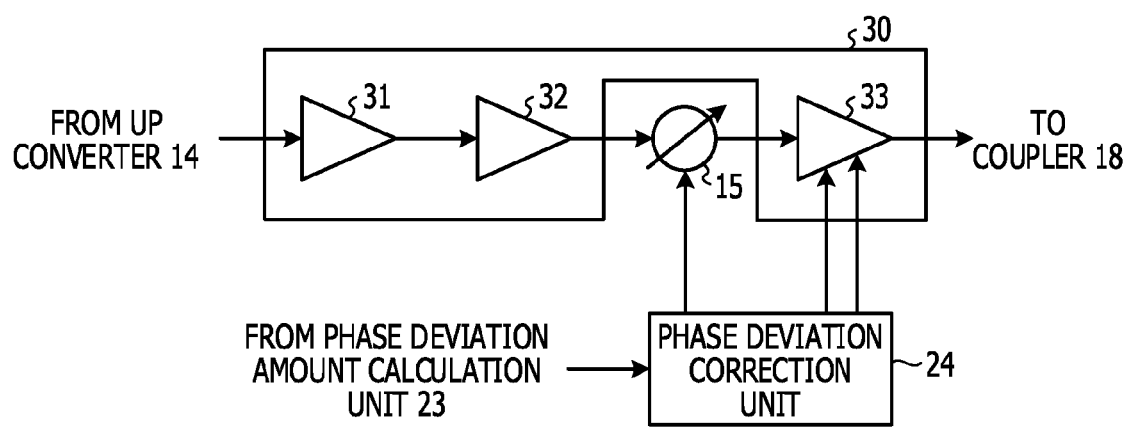
FIG. 9 is a block diagram depicting an example of a configuration of an amplification unit of a working example 3.

FIG. 9 is a block diagram depicting an example of a configuration of an amplification unit of the working example 3. In the working examples 1 and 2, a case is exemplified in which the amplification unit 16 includes the PA 17 disposed in one stage. In contrast, the amplification unit 30 in the working example 3 includes three stages of amplifier, namely, PAs 31, 32 and 33 coupled directly with each other as depicted in FIG. 9. The PA 31 amplifies power of a PD signal after up conversion and outputs the signal after the amplification to the PA 32. The PA 32 further amplifies the power of the signal after the amplification by the PA 31 and outputs the signal after the amplification to the PA 33 through the phase shifter 15. The PA 33 further amplifies the power of the signal after the amplification by the PA 32 and outputs the signal after the amplification to the coupler 18.

Where the amplification unit 30 includes three stages of amplifiers, namely, the PAs 31, 32 and 33, phase deviation between input and output signals occurs in each of the PAs 31, 32 and 33. Therefore, the signal outputted from the PA 32 includes not only the phase deviation by the PA 32 but also the phase deviation by the PA 31. Further, the signal outputted from the PA 33 includes not only the phase deviation by the PA 33 but also the phase deviation by the PA 31 and the phase deviation by the PA 32. Further, the distortion compensation unit 12 collectively compensates for the nonlinear distortion by all of the PAs 31, 32 and 33.

Therefore, it is efficient not to perform correction of phase deviation individually for each of the amplifiers, namely, the PAs 31, 32 and 33 but to collectively correct the phase deviation by all of the PAs 31, 32 and 33 in correction of the phase deviation for the PA 33 that is the last stage amplifier.

Further, where an amplification unit includes a plurality of stages of PAs, while the PAs other than the PA at the last stage are caused to operate in a linear region, the PA at the last stage is frequently caused to operate in the proximity of a saturation region.

Therefore, correction of phase deviation is performed only for the PA 33 that is the last stage amplifier from among the three stages of amplifiers, namely, the PAs 31, 32 and 33. In particular, the phase shifter 15 is disposed at a stage following the PA 32 and preceding to the PA 33 and changes the phase of a signal outputted from the PA 32 under the control of the phase deviation correction unit 24 in a similar manner as in the working example 1 or 2. Further, the phase deviation correction unit 24 corrects phase deviation by controlling the phase shifter 15, the gate voltage $V_{gs}$ of the PA 33 and the drain voltage $V_{ds}$ of the PA 33 in a similar manner as in the working example 1 or 2.

As described above, in the working example 3, the amplification unit 30 includes a plurality of amplifiers (for example, the PAs 31, 32 and 33) coupled in series and in multiple stages. The phase deviation correction unit 24 performs correction of phase deviation only for the amplifier of the last stage (for example, the PA 33) from among the plurality of amplifiers coupled in series and in multiple stages.

By the configuration described, the wireless apparatus wherein the amplification unit includes multiple stages of PAs can perform correction of phase deviation efficiently.

WORKING EXAMPLE 4

A working example 4 is different from the working examples 1 and 2 in the configuration of the amplification unit.

<Example of Configuration of Amplification Unit>

Figure 10:
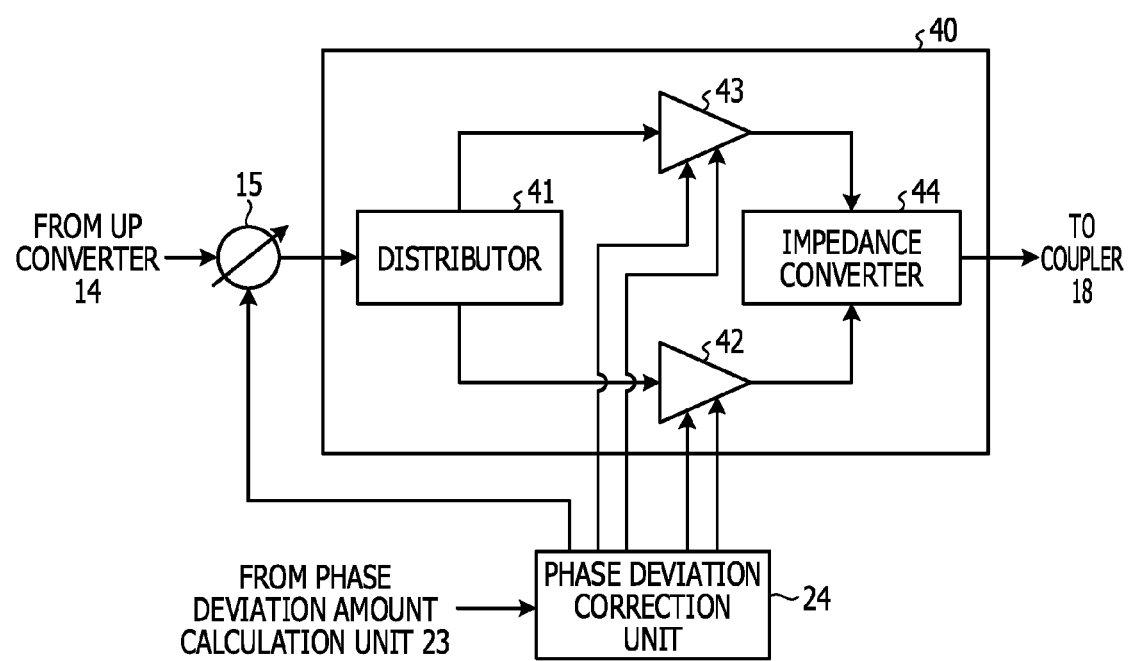
FIG. 10 is a block diagram depicting an example of a configuration of an amplification unit of a working example 4.

FIG. 10 is a block diagram depicting an example of a configuration of an amplification unit of the working example 4. Referring to FIG. 10, the amplification unit 40 includes a distributor 41, a carrier amplifier 42, a peak amplifier 43 and an impedance converter 44. In short, the amplification unit 40 is a Doherty type amplification unit.

The distributor 41 outputs a PD signal inputted thereto from the up converter 14 through the phase shifter 15 only to the carrier amplifier 42 if the power value of the PD signal is lower than a given threshold value. On the other hand, if the power value of the PD signal is equal to or higher than the given threshold value, then the distributor 41 outputs the PD signal to both of the carrier amplifier 42 and the peak amplifier 43.

The carrier amplifier 42 is an amplifier having linearity where the input power is low, and amplifies the power of a PD signal inputted thereto from the distributor 41 and outputs the signal after the amplification to the impedance converter 44. In contrast, the peak amplifier 43 is an amplifier used only where the input power is high, and amplifies the power of a PD signal inputted thereto from the distributor 41 and outputs the signal after the amplification to the impedance converter 44.

The impedance converter 44 receives a signal inputted thereto from the carrier amplifier 42 only when the power value of a PD signal inputted to the distributor 41 is lower than the given threshold value. Therefore, the impedance converter 44 outputs the signal inputted from the carrier amplifier 42 to the coupler 18.

Meanwhile, if the power value of the PD signal inputted to the distributor 41 is equal to or higher than the given threshold value, then the impedance converter 44 receives signals inputted thereto from both of the carrier amplifier 42 and the peak amplifier 43. Therefore, the impedance converter 44 adjusts the output impedance between the signal inputted thereto from the carrier amplifier 42 and the signal inputted thereto from the peak amplifier 43. After the adjustment of the output impedance, the impedance converter 44 combines the signal inputted from the carrier amplifier 42 and the signal inputted from the peak amplifier 43 and outputs the combined signal to the coupler 18.

In this manner, the amplification unit 40 generates, when the input power is low, an output signal only from a signal from the carrier amplifier 42, but combines, when the input power is high, a signal from the carrier amplifier 42 and a signal from the peak amplifier 43 and generates an output signal. Therefore, the characteristic of the amplification unit 40 coincides with the characteristic of the carrier amplifier 42 when the input power is low, but is, when the input power is high, a combination of the characteristic of the carrier amplifier 42 and the characteristic of the peak amplifier 43.

Here, although the carrier amplifier 42 has linearity where the input power is low, it does not have linearity where the input power is high. In contrast, while the peak amplifier 43 is used only when the input power to the amplification unit 40 is high as described above, the carrier amplifier 42 is used not only where the input power to the amplification unit 40 is low but also where the input power to the amplification unit 40 is high. In other words, while the peak amplifier 43 is used in a saturation region in which the phase deviation is great, the carrier amplifier 42 is used not only in a linear region but also in a saturation region in which the phase deviation is great.

Therefore, the phase deviation correction unit 24 performs correction of phase deviation for both of the carrier amplifier 42 and the peak amplifier 43. In particular, the phase shifter 15 is disposed in a stage preceding to the distributor 41, and changes the phase of a signal outputted from the up converter 14 similarly as in the working example 1 or 2 under the control of the phase deviation correction unit 24. Further, the phase deviation correction unit 24 corrects phase deviation by controlling the phase shifter 15, the gate voltage $V_{gs}$ of the carrier amplifier 42 and the peak amplifier 43 and the drain voltage $V_{ds}$ of the carrier amplifier 42 and the peak amplifier 43 similarly as in the working example 1 or 2.

As described above, in the working example 4, the amplification unit 40 is a Doherty type amplification unit that includes the carrier amplifier 42 and the peak amplifier 43. The phase deviation correction unit 24 performs correction of phase deviation for both of the carrier amplifier 42 and the peak amplifier 43.

By the configuration described, the wireless apparatus including a Doherty type amplification unit can set the deviation amount of phase deviation to a value within the range of the distortion compensation capacity of the PD with minimal power consumption. Therefore, the ACLR can be improved with minimal power consumption.

Here, in the Doherty type amplification unit, if the carrier amplifier 42 and the peak amplifier 43 are compared with each other, then since the carrier amplifier 42 operates at a higher rate, the effect of correction of phase deviation is higher for the carrier amplifier 42. Therefore, the phase deviation correction unit 24 may perform correction of phase deviation only for the carrier amplifier 42 from between the carrier amplifier 42 and the peak amplifier 43. If the configuration just described is adopted, then the wireless apparatus including the Doherty type amplification unit can perform correction of phase deviation efficiently.

OTHER WORKING EXAMPLES

[1] By calculating a phase error by the error calculation unit 124, the deviation amount of phase deviation can be calculated. Therefore, the calculation of the deviation amount of phase deviation may be performed by the error calculation unit 124 in place of the phase deviation amount calculation unit 23.

[2] In the working examples described above, the correction methods (1) to (3) are individually used independently of each other. However, the phase deviation correction unit 24 may correct phase deviation using a plurality of correction methods simultaneously. For example, the phase deviation correction unit 24 may use the correction method (1) and the correction method (2) simultaneously, or may use the correction method (1) and the correction method (3) simultaneously. The correction amount and the power consumption where the correction method (1) and the correction method (2) are used simultaneously are greater and higher than those in an alternative case in which the correction method (3) is used alone. Further, the correction amount and the power consumption where the correction method (1) and the correction method (3) are used simultaneously are greater and higher than those in an alternative case in which the correction method (1) and the correction method (2) are used simultaneously. Where the correction method (1) and the correction method (2) are used simultaneously, the combination of the correction method (1) and the correction method (2) corresponds, for example, to a correction method (4). Therefore, the correction method (4) is greater in correction amount and higher in power consumption than the correction method (3). On the other hand, where the correction method (1) and the correction method (3) are used simultaneously, the combination of the correction method (1) and the correction method (3) corresponds, for example, to a correction method (5). Therefore, the correction method (5) is greater in correction amount and higher in power consumption than the correction method (4).

Figure 11:
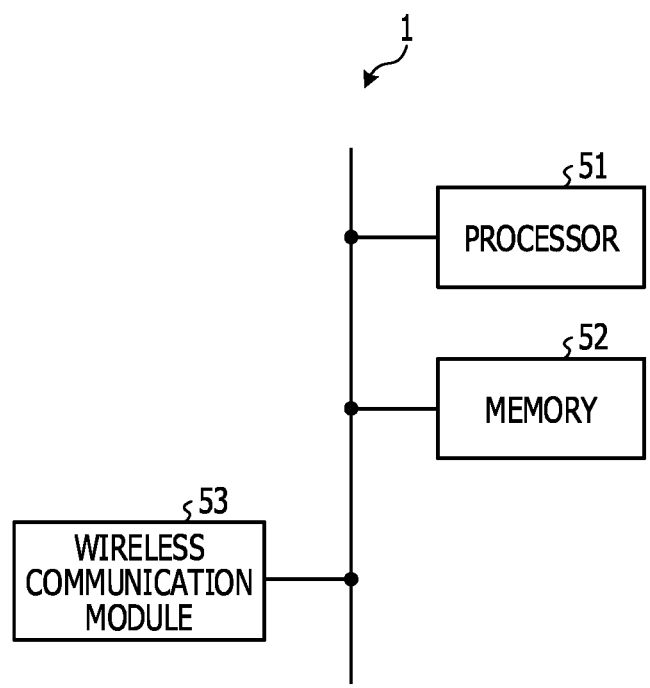
FIG. 11 is a view depicting an example of a hardware configuration of a wireless apparatus.

[3] The wireless apparatus 1 can be implemented, for example, by such a hardware configuration as described below. FIG. 11 is a view depicting an example of a hardware configuration of a wireless apparatus. As depicted in FIG. 11, the wireless apparatus 1 includes, as hardware components thereof, a processor 51, a memory 52 and a wireless communication module 53. As an example of the processor 51, a central processing unit (CPU), a digital signal processor (DSP), a field programmable gate array (FPGA) and so forth are available. Further, the wireless apparatus 1 may include a large scale integrated circuit (LSI) including the processor 51 and peripheral circuits. As an example of the memory 52, a random-access memory (RAM) such as a synchronous dynamic (SD) RAM, a read-only memory (ROM), a flash memory and so forth are available.

For example, the DAC 13, up converter 14, phase shifter 15, amplification unit 16, 30 or 40, coupler 18, antenna 19, down converter 21 and ADC 22 are implemented by the wireless communication module 53. Further, for example, the baseband unit 11, distortion compensation unit 12, power calculation unit 25, phase deviation amount calculation unit 23 and phase deviation correction unit 24 are implemented by the processor 51. Further, for example, the distortion compensation table 123 is stored in the memory 52.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A wireless apparatus comprising:
an amplification circuit configured to generate a second signal by amplifying power of a first signal;
a calculation circuit configured to calculate a deviation amount of phase deviation of the second signal from the first signal; and
a correction circuit configured to:
correct the phase deviation using a first correction method that possesses a first correction amount and first power consumption when an absolute value of the deviation amount is equal to or higher than a first threshold value; and
correct the phase deviation using a second correction method that possesses a second correction amount greater than the first correction amount and second power consumption higher than the first power consumption when the absolute value of the deviation amount calculated after correcting the phase deviation using the first correction method is equal to or higher than the first threshold value.

2. The wireless apparatus according to claim 1, wherein the plurality of correction methods are respectively associated with a plurality of value ranges of the absolute value of the deviation amount, and
the correction circuit is configure to correct the phase deviation using a specified correction method corresponding to a specified value range within which the absolute value of the deviation amount falls from among the plurality of value ranges.

3. The wireless apparatus according to claim 1, further comprising:

a distortion compensation circuit configured to compensate for distortion occurring in the second signal based on the first signal and the second signal, wherein the first threshold value is determined based on a distortion compensation capacity of the distortion compensation circuit.

4. The wireless apparatus according to claim 1, wherein the correction circuit is configured to correct the phase deviation when a power of the second signal is equal to or higher than a second threshold value, but not to correct the phase deviation when the power of the second signal is lower than the second threshold value.

5. The wireless apparatus according to claim 1, wherein the amplification circuit includes a plurality of amplifiers coupled in series, and the correction circuit is configured to correct the phase deviation only for a last amplifier of the plurality of amplifiers.

6. The wireless apparatus according to claim 1, wherein the amplification circuit is a Doherty type that includes a carrier amplifier and a peak amplifier, and the correction circuit is configured to correct the phase deviation for both of the carrier amplifier and the peak amplifier.

7. The wireless apparatus according to claim 1, wherein the amplification circuit is a Doherty type that includes a carrier amplifier and a peak amplifier, and the correction circuit is configured to correct the phase deviation for the carrier amplifier but not to correct the phase deviation for the peak amplifier.

\* \* \* \* \*